US012627538B2

(12) United States Patent (10) Patent No.: US 12,627,538 B2
Behravan et al. (45) Date of Patent: May 12, 2026

(54) METHODS OF NONLINEARITY ESTIMATION, REPORTING, AND COMPENSATION

(71) Applicant: Telefonaktiebolaget LM Ericsson (publ), Stockholm (SE)

(72) Inventors: Ali Behravan, Stockholm (SE); Hamed Farhadi, Stockholm (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 25 days.

(21) Appl. No.: 18/708,004

(22) PCT Filed: Nov. 11, 2021

(86) PCT No.: PCT/EP2021/081382
§ 371 (c)(1),
(2) Date: May 7, 2024

(87) PCT Pub. No.: WO2023/083453
PCT Pub. Date: May 19, 2023

(65) Prior Publication Data
US 2025/0030580 A1      Jan. 23, 2025

(51) Int. Cl.
H04L 25/03 (2006.01)
H03F 1/32 (2006.01)
(Continued)

(52) U.S. Cl.
CPC ..... H04L 25/03343 (2013.01); H03F 1/3247 (2013.01); H03F 1/3258 (2013.01); H04B 1/0475 (2013.01); H04B 1/1027 (2013.01)

(58) Field of Classification Search
CPC ............. H04L 25/03343; H04L 27/368; H03F 1/3247; H03F 1/3258; H03F 2200/451;
(Continued)

(56) References Cited

U.S. PATENT DOCUMENTS 10,588,038 B2    3/2020  Eitan et al.
11,108,419 B2 *  8/2021  Sagi .................. H04L 25/03019
(Continued)

OTHER PUBLICATIONS

International Search Report and Written Opinion for PCT/EP2021/081382, dated Jul. 18, 2022, 8 pages.

*Primary Examiner* — Emmanuel Bayard
(74) *Attorney, Agent, or Firm* — Rothwell, Figg, Ernst & Manbeck, P.C.

(57) ABSTRACT
In one aspect, a method performed by a transmitter in a first device for signaling a nonlinearity profile of distortion of transmissions in a communications network is provided. The method includes generating an amplitude tracking reference signal (ATRS), wherein the ATRS comprises information indicating a nonlinearity profile of distortions of transmissions by the transmitter, and transmitting the generated ATRS towards a second device. In another aspect, a method performed by a receiver in a second device for identifying a nonlinearity profile of distortion of transmissions in a communications network by a transmitter in a first device is provided. The method includes receiving an ATRS from the first device, wherein the ATRS comprises information indicating a nonlinearity profile of distortions of transmissions by the transmitter and identifying the nonlinearity profile of distortion of transmissions by the transmitter based on the ATRS.

20 Claims, 19 Drawing Sheets

(51) Int. Cl.
*H04B 1/04* (2006.01)
*H04B 1/10* (2006.01)

(58) Field of Classification Search
CPC ...... H03F 1/3282; H03F 3/189; H03F 3/2175;
H03F 1/3294; H03F 3/24; H04B 1/0475;
H04B 1/1027
USPC ......................... 375/219–222, 262, 295–297
See application file for complete search history.

(56) References Cited

U.S. PATENT DOCUMENTS

| | | | |
|---|---|---|---|
| 12,218,868 B2 * | 2/2025 | Paz | H04L 25/0224 |
| 2019/0190552 A1 * | 6/2019 | Sagi | H04L 25/0226 |
| 2021/0376978 A1 * | 12/2021 | Paz | H04L 5/0048 |
| 2023/0091116 A1 * | 3/2023 | Kutz | H03F 1/32 |
| | | | 370/329 |
| 2023/0143623 A1 * | 5/2023 | Laufer | H04W 24/08 |
| | | | 455/522 |

* cited by examiner

100

104

UE

102

Network node

102

Network node

Downlink transmission

104

Device

1501

Capability of ATRS transmission

1503

Capability of nonlinearity estimation

1505

Schedule ATRS

1507

ATRS transmission

1509

Identify
nonlinearity
profile

1511

Adjust receiver to
nonlinearity

1513

Feedback nonlinearity profile

1513

Adjust to
transmitter
nonlinearity

1700 s1702 generating an amplitude tracking reference signal (ATRS), wherein the ATRS comprises information indicating a nonlinearity profile of distortions of transmissions by the transmitter s1704 transmitting the generated ATRS towards a second device

1800 s1802 receiving an amplitude tracking reference signal (ATRS) from the first device, wherein the ATRS comprises information indicating a nonlinearity profile of distortions of transmissions by the transmitter s1804 identifying the nonlinearity profile of distortion of transmissions by the transmitter based on the ATRS

METHODS OF NONLINEARITY ESTIMATION, REPORTING, AND COMPENSATION

CROSS REFERENCE TO RELATED APPLICATION(S)

This application is a 35 U.S.C. § 371 National Stage of International Patent Application No. PCT/EP2021/081382, filed Nov. 11, 2021, the disclosure of which is incorporated herein by reference in its entirety.

TECHNICAL FIELD

Disclosed are embodiments related to nonlinearity estimation, reporting, and compensation in communications networks.

Introduction

Impact of Nonlinearity on Communication Systems

In orthogonal frequency division multiplexing (OFDM), parallel data symbols modulate several closely spaced subcarriers in order to cope with the frequency selectivity of the channel in high data rate transmission. The narrowband sub-channels experience almost flat fading in a highly time dispersive multipath channel.

OFDM as well as another variation, Discrete Fourier Transform Spread OFDM (DFTS-OFDM), are used in 3GPP Evolved Universal Mobile Telecommunications System (UMTS) Terrestrial Radio Access (E-UTRA) and 5G NR as main modulation schemes in downlink and uplink. A major problem in OFDM systems is high peak-to-average power ratio (PAPR) due to aggregation of many independent modulation symbols. High PAPR causes either non-efficient use of the high-power amplifiers or high nonlinearity distortion in the system.

FIG. 2 illustrates a representation of 16 Quadrature Amplitude Modulation (QAM)-OFDM in the in-phase/quadrature (I/Q) plane at a receiver when a soft-limiter nonlinearity is used at the transmitter. FIG. 2 shows an (I/Q) representation of a received modulation constellation when OFDM modulated symbols go through a soft-limiter nonlinearity, with input-output characteristic:

$$y = \begin{cases} x & |x| \le th \\ \dfrac{x}{|x|} \cdot th & |x| > th \end{cases}$$

Note that the cloud around each constellation point is due to only the nonlinear distortion, and there is no channel noise.

FIG. 3 illustrates instantaneous power per mean power of OFDM symbols before and after a soft limiter. FIG. 3 shows a cumulative distribution function (CDF) of the instantaneous power of the OFDM signal relative to its mean power, before and after a soft-limiter. As illustrated in FIGS. 2-3, the nonlinearity causes a distortion on the received symbols that appears as a noise-like cloud, and the instantaneous power of the signal (i.e. the amplitude) of the transmit signal is clipped.

FIG. 4 illustrates distortion distributions due to power amplifier nonlinearities in the spatial and frequency domain in a Multiple-Input Multiple-Output (MIMO)-OFDM system with two transmit antenna. FIG. 4 shows the transmitted signal power and the corresponding distortion power due to power amplifier nonlinearities in OFDM signal in multi-antenna systems. As shown in FIG. 4, in multi-antenna systems, the distortion is not limited to the directions and the subcarriers in which the signals are transmitted, but there are also distortions in certain new directions and subcarriers.

FIG. 5 illustrates a link performance of a two-antenna system in the presence of different levels of distortions due to power amplifier nonlinearities. The throughput in the presence of different level of distortions measured by error vector magnitude (EVM) is shown.

In a power amplifier, the nonlinear conversion from input amplitude to output amplitude (amplitude modulation to amplitude modulation, or AM/AM) is likely a smooth curve. Note that in addition to amplitude distortion, most power amplifiers have a phase distortion as a function of the input amplitude variation, which is called amplitude modulation to phase modulation conversion (AM/PM). A phase conversion causes a rotation in the signal constellation in FIG. 2.

PA Nonlinearity Compensation

To reduce the distortion due to nonlinearity, a predistorter can be implemented before the nonlinearity at the transmitter or a nonlinear equalizer is used at the receiver to compensate for the nonlinearity effects. In both of these solutions, an estimate of the nonlinearity profile is needed to design the predistorter or the equalizer.

FIG. 6 is a schematic diagram of a transmitter and a receiver with digital pre-distortion at the transmitter side. In this system, the transmitter 602 includes a predistorter 603, which is a functional block located prior to the power amplifier (PA) 611. The predistorter 603 can be implemented in the digital baseband domain and generates a complementary nonlinearity to that of the PA 611 so that the overall system has linear or approximately linear characteristics. The predistorted baseband signal 601 is then converted to the analog domain using a digital to analog converter (DAC) 605, and is up-converted to the Radio Frequency (RF) domain using an I/Q modulator 607 and next fed to the PA 611 and antenna 613. To be able to synthesize the predistorter 603, a portion of the signal from the PA 611 is extracted, e.g. using a signal splitter or a coupler, and is down-converted to the baseband signal through I/Q demodulator 625 and analog to digital converter (ADC) 627. The signal is used in the PA model parameter identifier functional block 629 to estimate the PA model parameters and to compute the predistorter function parameters.

FIG. 6 also illustrates a receiver 604, which includes an antenna 615, Low Noise Amplifier (LN) 617, I/Q demodulator 619, DC 621, and baseband processing block 623.

PA Nonlinearity Variation Over Time

The performance of a power amplifier depends on different factors, including temperature. For instance, for a designed PA in low temperature working conditions, the gain decreases almost linearly and the drain current slightly increases. In addition, intermodulation distortion (IMD) has a temperature dependency, and IMD can be improved in low temperatures due to the increase of gain and drain current.

At a network node or device, the temperature can vary due to different reasons, e.g. due to turning the sleep mode on/off in MIMO systems, changing traffic load, and variations of the power dissipation. The resulting temperature variations cause changes in the quality of the transmit RF hardware, which can be measured by different metrics e.g. by error-vector-magnitude (EVM), adjacent carrier leakage ratio (ACLR), or IMD. The quality of a communication link fluctuates due to these variations, and could cause performance degradation if not properly compensated.

SUMMARY

The nonlinearity profile must be known for efficient design of a digital pre-distorter (DPD) at the transmitter to reduce the distortions due to PA nonlinearities or a nonlinear equalizer or digital post distorter at the receiver to compensate for the impact of PA nonlinearities. While the PA may sometimes be considered a main component contributing to nonlinearity, there may be different factors or components that contribute to nonlinearity such as a clipper, digital to analog converter, filters, etc. For the predistorter design, the nonlinearity profile of the power amplifier as well as other nonlinearities of the RF front-end should be known at the transmitter. Similarly, for the equalizer design or digital post-distortion at the receiver, the nonlinearity profile has to be known at the receiver. However, existing approaches are not practical because the nonlinearity characteristics change due to the environment (heat, traffic load, etc.), the hardware's operating point (transmit power, etc.), and other elements that come between the transmitter and receiver, such as antennas, wires, etc.

Accordingly, embodiments disclosed herein provide a reference signal design that can be used to identify the nonlinearity profile that causes nonlinear distortion. Additional embodiments propose a receiver architecture to identify the nonlinearity profile, and a method at the receiver to use the identified nonlinearity profile to configure receiver settings for compensating the nonlinearity and for decoding of data, a feedback to report the identified nonlinearity profile to the transmitter, and methods at the transmitter to configure transmitter settings to compensate nonlinearity.

In one aspect, a method performed by a transmitter in a first device for signaling a nonlinearity profile of distortion of transmissions in a communications network is provided. The method includes generating an amplitude tracking reference signal (ATRS), wherein the ATRS comprises information indicating a nonlinearity profile of distortions of transmissions by the transmitter. The method includes transmitting the generated ATRS towards a second device.

In another aspect, a method performed by a receiver in a second device for identifying a nonlinearity profile of distortion of transmissions in a communications network by a transmitter in a first device is provided. The method includes receiving an amplitude tracking reference signal (ATRS) from the first device, wherein the ATRS comprises information indicating a nonlinearity profile of distortions of transmissions by the transmitter. The method includes identifying the nonlinearity profile of distortion of transmissions by the transmitter based on the ATRS.

In another aspect there is provided a device adapted to perform the methods. In another aspect there is provided a computer program comprising instructions which when executed by processing circuitry of a device causes the device to perform the methods. In another aspect there is provided a carrier containing the computer program, where the carrier is one of an electronic signal, an optical signal, a radio signal, and a computer readable storage medium.

BRIEF DESCRIPTION OF THE DRAWINGS

The accompanying drawings, which are incorporated herein and form part of the specification, illustrate various embodiments.

DETAILED DESCRIPTION

Embodiments disclosed herein provide methods to identify the transmitter nonlinearity that provide a number of advantages over prior techniques.

For example, the embodiments disclosed herein and the proposed ATRS signal enable tracking the time variation of nonlinearity profile (e.g. PA nonlinearity) due to factors such as temperature variations, traffic load, operating point adaptation, etc. In addition, the embodiments disclosed herein enable nonlinearity compensation methods at the transmitter side and the receiver side, for example: (a) to compensate the impact of distortions due to nonlinearity by performing digital post processing or a nonlinearity-aware demapper based on the extracted nonlinearity profile, and/or (b) to reduce the distortion created at the transmitter side by performing digital pre distortion at the transmitter side to effectively linearize the power amplifier.

Figure 6:
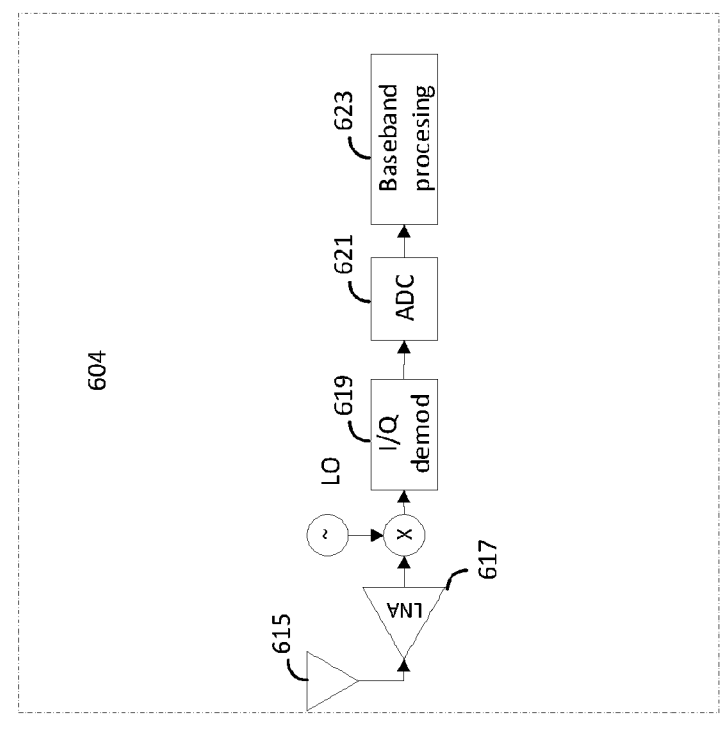
FIG. 6 illustrates a schematic diagram of a system with digital pre distortion at the transmitter side.
Figure 6:
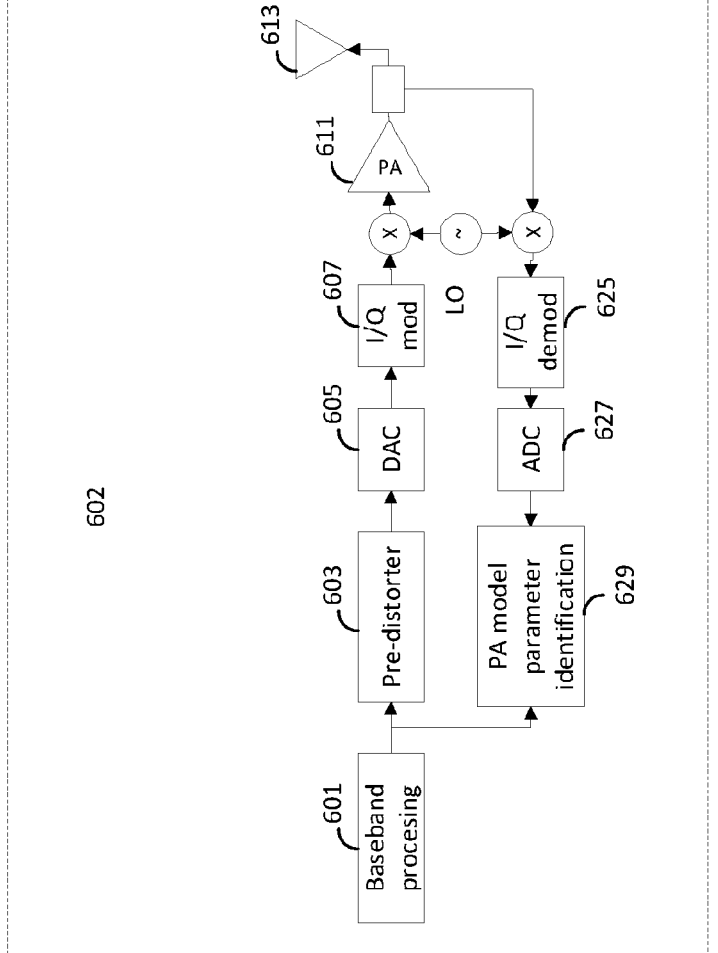

Embodiments disclosed herein also reduce the complexity of the digital pre distortion at the transmitter side. Embodiments disclosed herein remove the need for sampling, down-conversion, analog-to-digital conversion, and parameter estimation at the transmitter that are shown in FIG. 6 in order to extract the PA parameters to compute the pre-distortion function. The reduction in the complexity of the digital pre distortion at the transmitter side reduces the energy consumption, hence improving the energy efficiency of the transmitter, and reduces the cost of the transmitter by removing the need for coupler/splitter, mixer, I/Q demodulator, and ADC in the feedback loop of the transmitter.

This embodiments disclosed herein further enable reduction and compensation of PA nonlinearities while the PA is operating in the nonlinear regime where the PA is more energy efficient, thereby improving the energy efficiency of the transmitter.

The following advantages, among others, may be provided by the embodiments disclosed herein in the downlink (DL) and uplink (UL) scenarios.

DL scenario with PA at the base station (BS): (a) enables more nonlinear PA operation at the BS, which increases energy efficiency of the BS; (b) reduces the requirements on a DPD at BS, thereby reducing the energy requirements for digital processing at baseband; (c) lowers heat dissipation at BS, which allows for smaller BS radio units due to reducing the requirements on heat sinks; and (d) enhances DL coverage/throughput.

UL scenario with PA at the user equipment (UE): (a) enables more nonlinear PA operation at UE, (b) reduces energy consumption at UE, (c) longer UE battery lifetime, and (d) enhances UL coverage/throughput.

Figure 1:
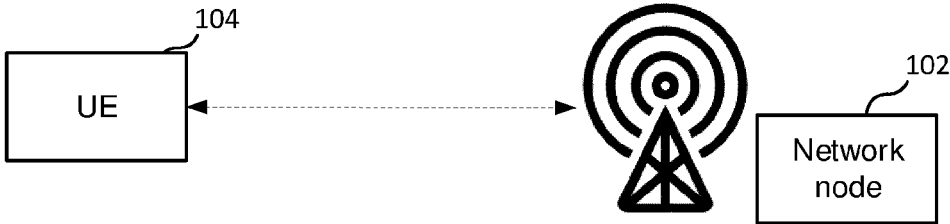
FIG. 1 is a block diagram according to some embodiments.
Figure 2:
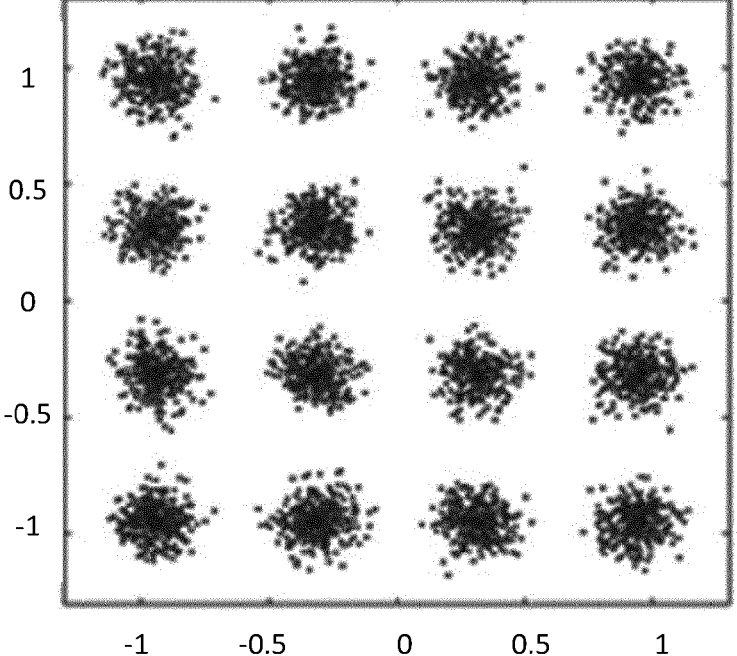
FIG. 2 illustrates a representation of 16 Quadrature Amplitude Modulation (QAM)-OFDM in the in-phase/ quadrature (I/Q) plane at a receiver when a soft-limiter nonlinearity is used at the transmitter.
Figure 3:
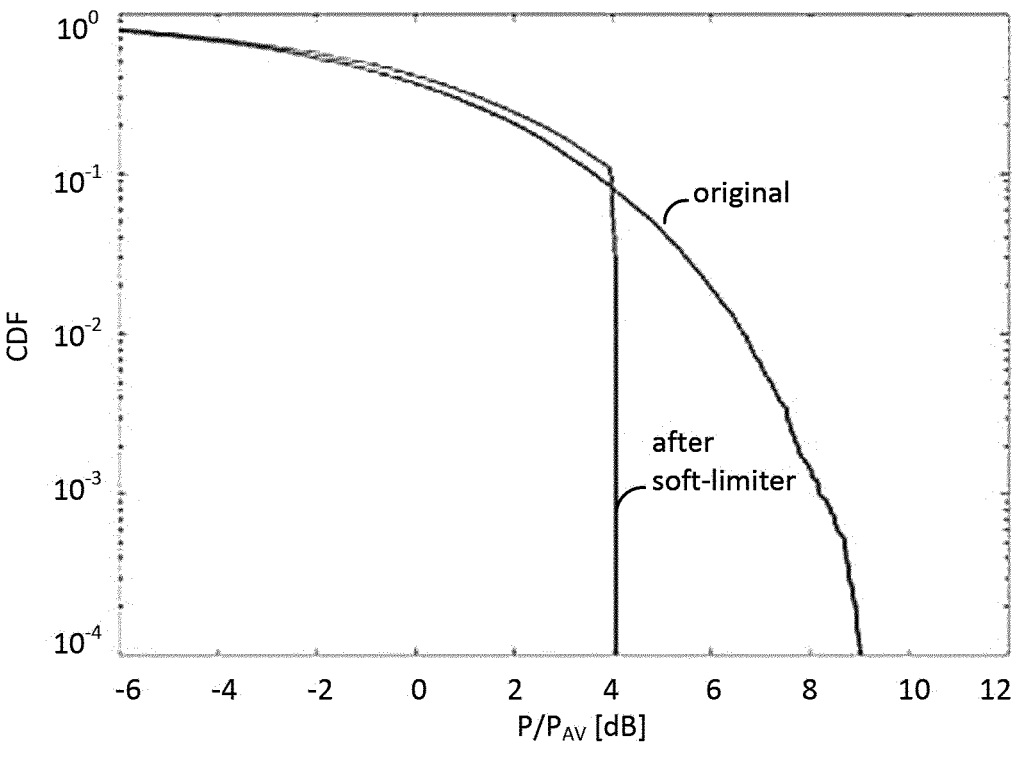
FIG. 3 illustrates instantaneous power per mean power of OFDM symbols before and after a soft limiter.
Figure 4:
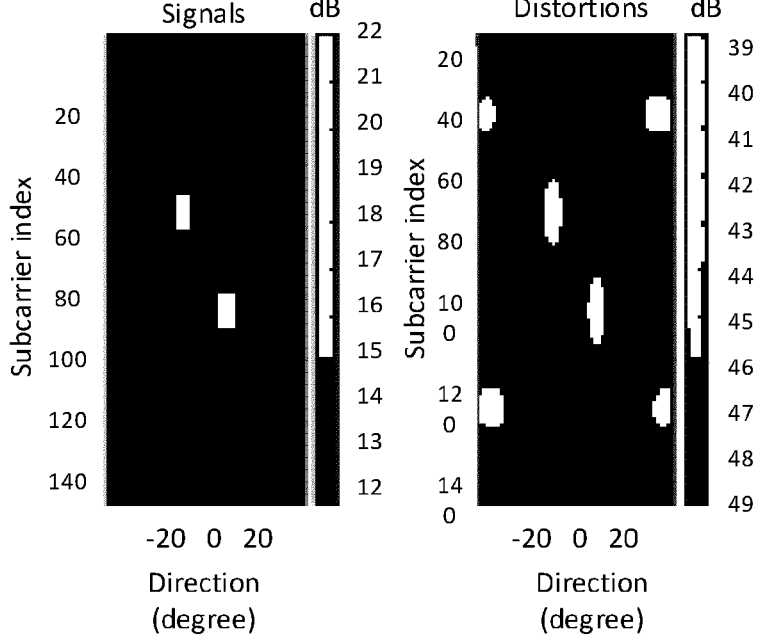
FIG. 4 illustrates distortion distributions due to power amplifier nonlinearities in the spatial and frequency domain in a MIMO-OFDM system with two transmit antenna.
Figure 5:
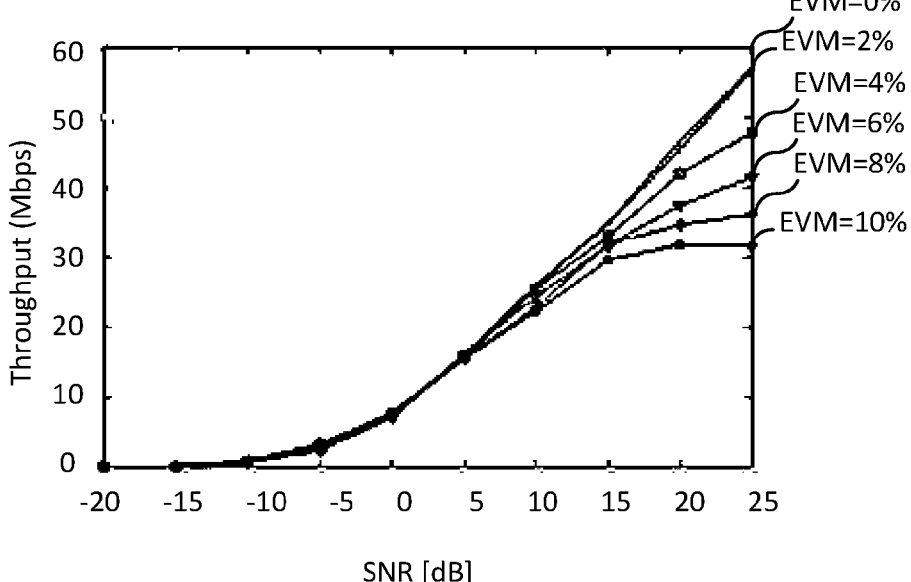
FIG. 5 illustrates a link performance of a two-antenna system in the presence of different levels of distortions due to power amplifier nonlinearities.

FIG. 1 illustrates a block diagram according to some embodiments. System 100 may include a user equipment 104 in communication with a network node 102 (e.g., a base station). According to the embodiments disclosed herein, the transmitter may be implemented in the UE 104 or in the network node 102, and the receiver may be implemented in the UE 104 or in the network node 102.

Figure 7:
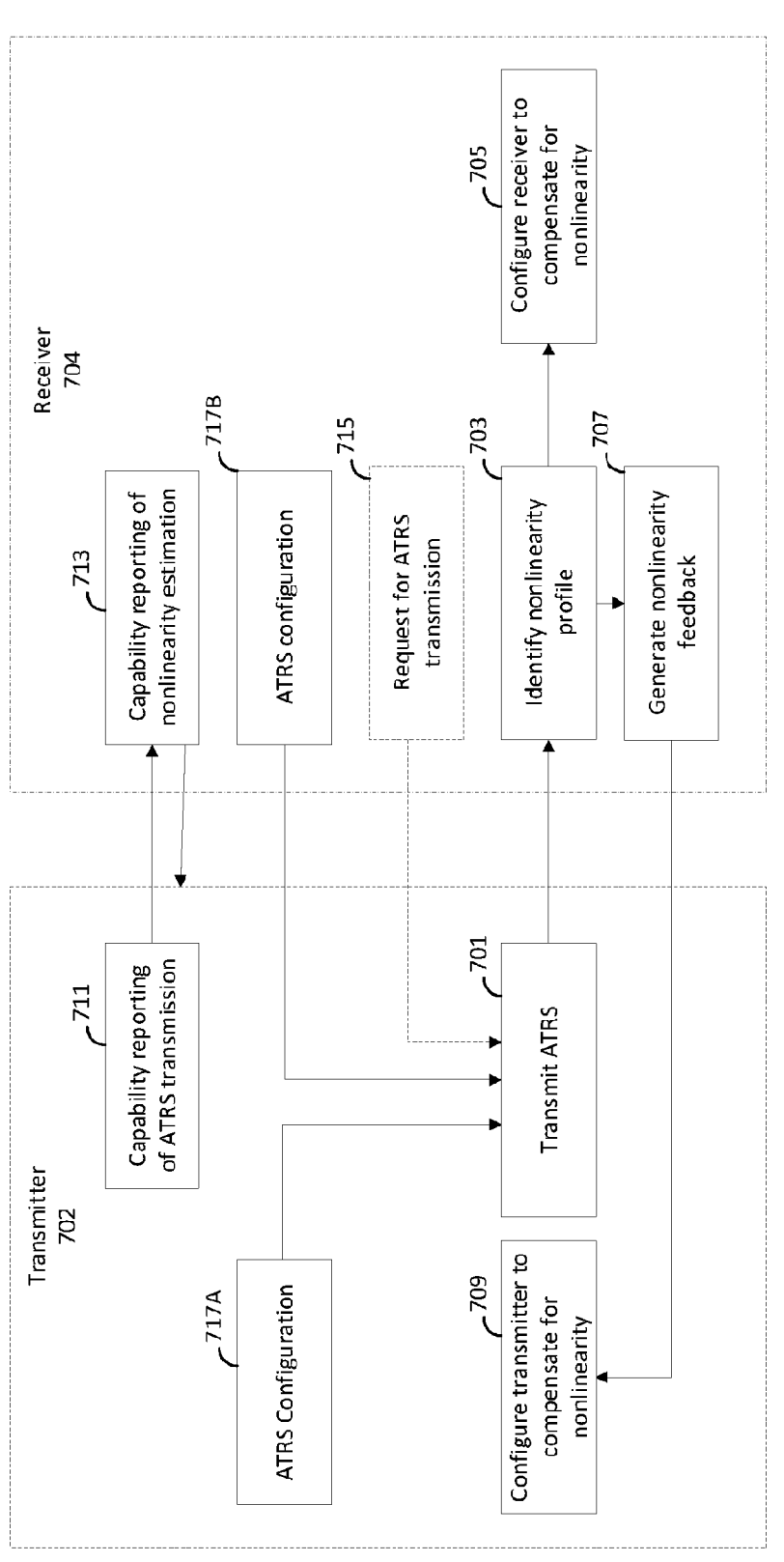
FIG. 7 is a flow diagram according to some embodiments.

FIG. 7 is a flow diagram according to some embodiments. Steps 701, 709, 711, and 717A may be performed by a transmitter 702, and steps 703, 705, 707, 713, 715, and 717B may be performed by a receiver 704.

At 701, the transmitter 702 generates an amplitude tracking reference signal (ATRS).

At 703, the receiver 704 identifies the nonlinearity profile using a measurement on the ATRS.

At 705, the receiver 704 uses the identified nonlinearity profile to configure the receiver for compensating nonlinearities.

At 707, the receiver 704 generates feedback to report the identified nonlinearity profile to the transmitter 702.

At 709, the transmitter 702 use the reported nonlinearity profile to configure the transmitter. A few possible examples of transmitter setting configuration may include one or more of the following: (a) perform digital pre distortion at the transmitter side to reduce the distortion; (b) adapt MCS index; (c) control transmit power; (d) adapt the number of transmit layers in multi antenna systems; (e) adapt crest factor reduction; (f) adapt the radio resource mapping; and/or (g) configure carrier aggregation.

At 711, the transmitter 702 reports capability reporting of ATRS transmission to the receiver 704.

At 713, the receiver 704 reports capability reporting of the nonlinearity estimation to the transmitter 702.

At 715, the receiver 704 optionally requests ATRS transmission.

At 717B, the receiver 704 configures ATRS transmission, and at 717A, the transmitter 702 configures ATRS transmission.

Each of these steps is described in further detail below.
701: Sending an Amplitude Tracking Reference Signal (ATRS)

According to some embodiments, a pre-defined reference signal with a pre-configured period is generated at the transmitter and transmitted on preconfigured resources. The reference signal is used at the receiver to estimate the nonlinearity profile of the transmitter by determining the changes on the amplitude and the phase of the signal.
Generate Amplitude Tracking Reference Signal In one embodiment, in order to capture the amplitude conversion characteristics of a nonlinearity, a known sequence of symbols is generated at the transmitter and is sent through the nonlinearity and over the channel to a receiver. The distorted sequence is used either at the receiver or after the nonlinearity at the transmitter to estimate the nonlinearity profile. The sequence of symbols can be a known set of QAM symbols or any known sequence, where the resulting baseband signal forms a varying range of amplitudes. In case of an OFDM transmitter with N subcarriers, the baseband signal at the output of the Inverse Fast Fourier Transform (IFFT) follows a complex Gaussian distribution with an amplitude that follows a Rayleigh distribution with a maximum peak to average power of N. In other words, a sequence of independent and identically distributed QAM symbols creates a sequence with large amplitude variation that can be useful for amplitude tracking.

In another example, a set of known signals with different amplitude (hence different transmit power) from a set of known reference signals can be transmitted such that the dynamic range of the nonlinear operation can be covered.

Alternatively, in the UL, other UE-specific reference sequences such as sounding reference signal (SRS), or demodulation reference signal (DMRS) may also be used for amplitude tracking and nonlinearity estimation.

In the DL either a cell-specific or a UE-specific signal may be used for amplitude tracking and nonlinearity estimation.
Mapping ATRS to Resource Blocks The generated ATRS can be mapped to specific radio resource blocks across the time-frequency domain to provide nonlinearity estimation with the desired periodicity in time or frequency depending on the rate of change of nonlinearities in these domains. For example, if it is expected that the traffic load, and hence the temperature, fluctuates over a short period of time, ATRS will be mapped for transmission more often.
703: Identifying the Nonlinearity Profile Using the Measurement on the ATRS According to the this embodiment, a nonlinearity profile is identified at the receiver based on measurements on a known reference signal and the relationship between the amplitude and phase of the received signal and the amplitude and phase of the transmitted ATRS described above. The measured amplitude is distorted due to the noise in the channel. However, in the case of an Additive White Gaussian Noise (AWGN) channel, the noise can be averaged out over multiple symbol measurements. A similar procedure can be followed for identifying AM/PM conversion of a nonlinear PA. Also, due to the signal propagation through the channel, the amplitude is subject to attenuation which can be compensated by performing the equalization over the received symbols. The nonlinearities can be identified using one of the following example methods.
Regression Method Parametric models (e.g. a polynomial expansion) can be trained based on the training data corresponding to input and output of different nonlinear systems to characterize the nonlinearities. The models can be trained using training data based on offline measurements. For example, a third-order polynomial expansion to model nonlinearities can be specified as follows:

$$y = \beta_1 x + \beta_2 x^2 + \beta_3 x^3,$$

where the model parameters $\beta_1$, $\beta_2$, and $\beta_3$ can be identified based on training data to minimize a cost function such as mean square error. For example, there are N pair of training samples represented as $(x_i, y_i)$, where N is the number of the training samples. Next, the training of the model parameters can be formulated as follows:

$$\underset{\beta_1,\beta_2,\beta_3}{\mathrm{argmin}} \sum_{i=1}^{N} |\beta_1 x_i + \beta_2 x_i^2 + \beta_3 x_i^3 - y_i|^2.$$

Gaussian Regression Method

Non-parametric models can be trained based on the training data corresponding to input and output of different nonlinear systems to characterize the nonlinearities using a Gaussian regression method. In this method, a Gaussian process can be used as a prior probability distribution over nonlinear functions in Bayesian inference to model nonlinearity. Given any set of N pair of points of the input and output of the functions, a multivariate Gaussian process whose covariance matrix parameter is the Gram matrix of the N points with some desired kernel can be computed based on the measurement signals. In this method, a covariance is constructed, which describes the correlations between all the input and output variables taken in N points. The computed covariance matrix can be used to interpolate the output of the nonlinear function for a given input.

Neural Network

Figure 8:
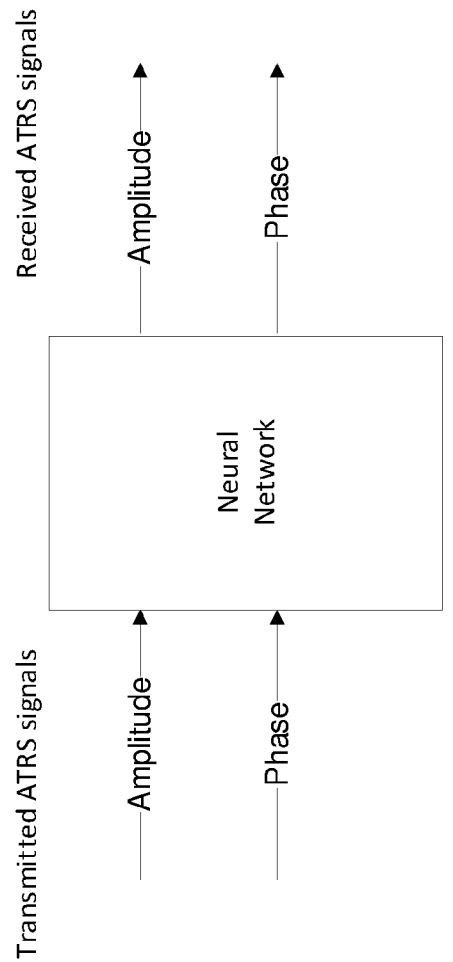
FIG. 8 is a neural network according to some embodiments.

Alternatively, neural network models can be trained to capture the nonlinearity profile using the measured ATRS and the known transmitted ATRS as labels. FIG. 8 is a neural network, according to some embodiments. A feed-forward neural network with multiple layers where each layer is composed of several neurons can be used to approximate the nonlinear relation of the transmitted ATRS and the measured ATRS as shown in FIG. 8. The weight and bias values of the neural network are determined by minimizing a cost function (e.g. mean square error) between the received ATRS signals and the approximated ATRS signals which are computed by applying the neural network to the transmitted ATRS signals.

Figure 9:
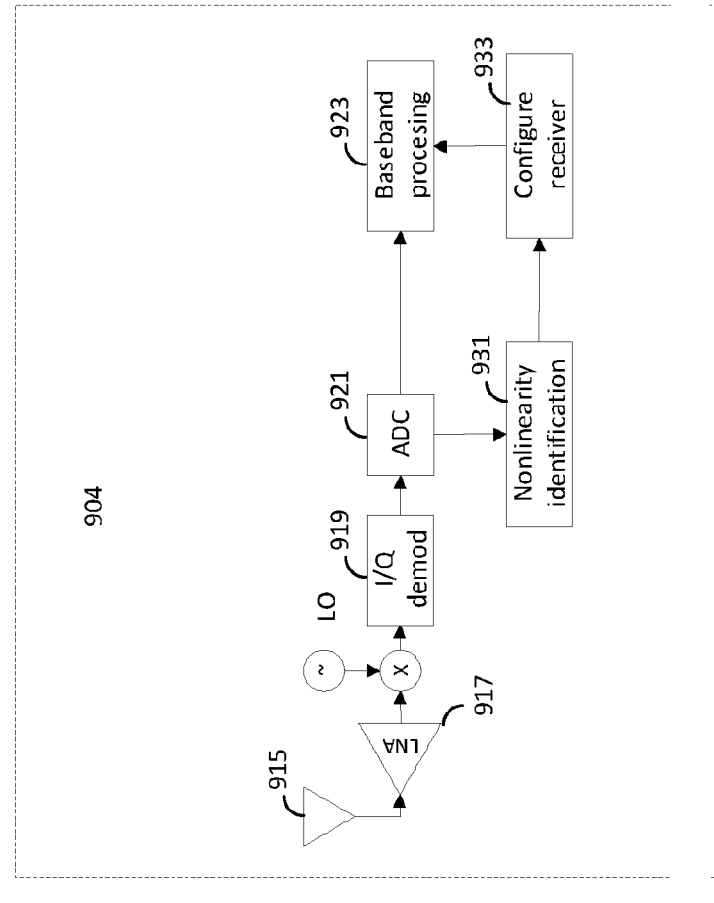
FIG. 9 illustrates a schematic diagram of a system with nonlinearity compensation enabled with ATRS according to some embodiments.
Figure 9:
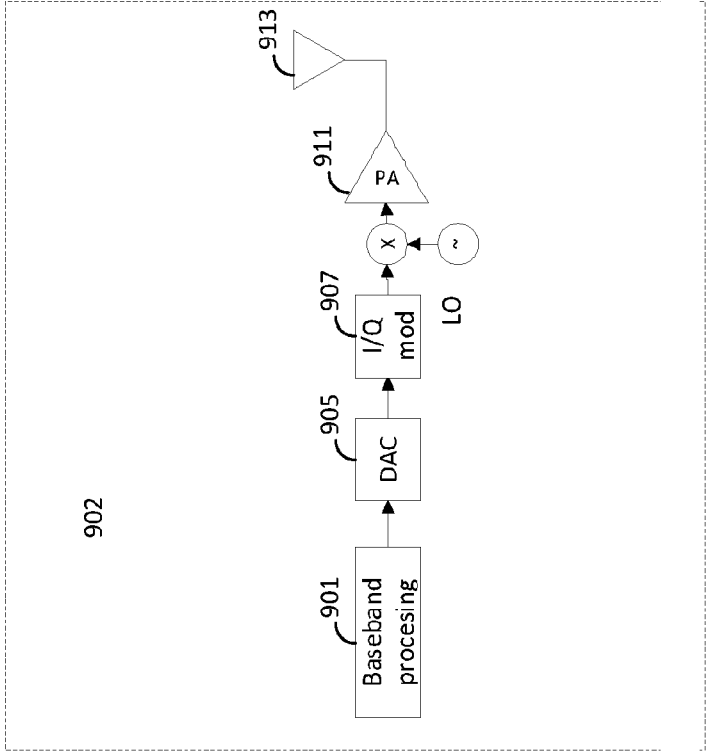

705: Compensating Nonlinearities at Receiver Using the Inferred Nonlinearity Profile FIG. 9 illustrates a schematic diagram of a system with nonlinearity compensation enabled with ATRS according to some embodiments. FIG. 9 illustrates a transmitter 902 with baseband processing 901, DAC 905, I/Q modulator 907, PA 911, and antenna 913. FIG. 9 illustrates a receiver 104 with antenna 915, LNA 917, I/Q demodulator 919, ADC 921, and baseband processing 923. The identified nonlinearity 931 at the receiver side can be used to configure receiver's parameters 933 to compensate nonlinearities as illustrated in FIG. 9.

A few techniques to compensate nonlinearity at the receiver are listed below.

Nonlinearity Compensation at Receiver Using Autoencoder

Figure 10:
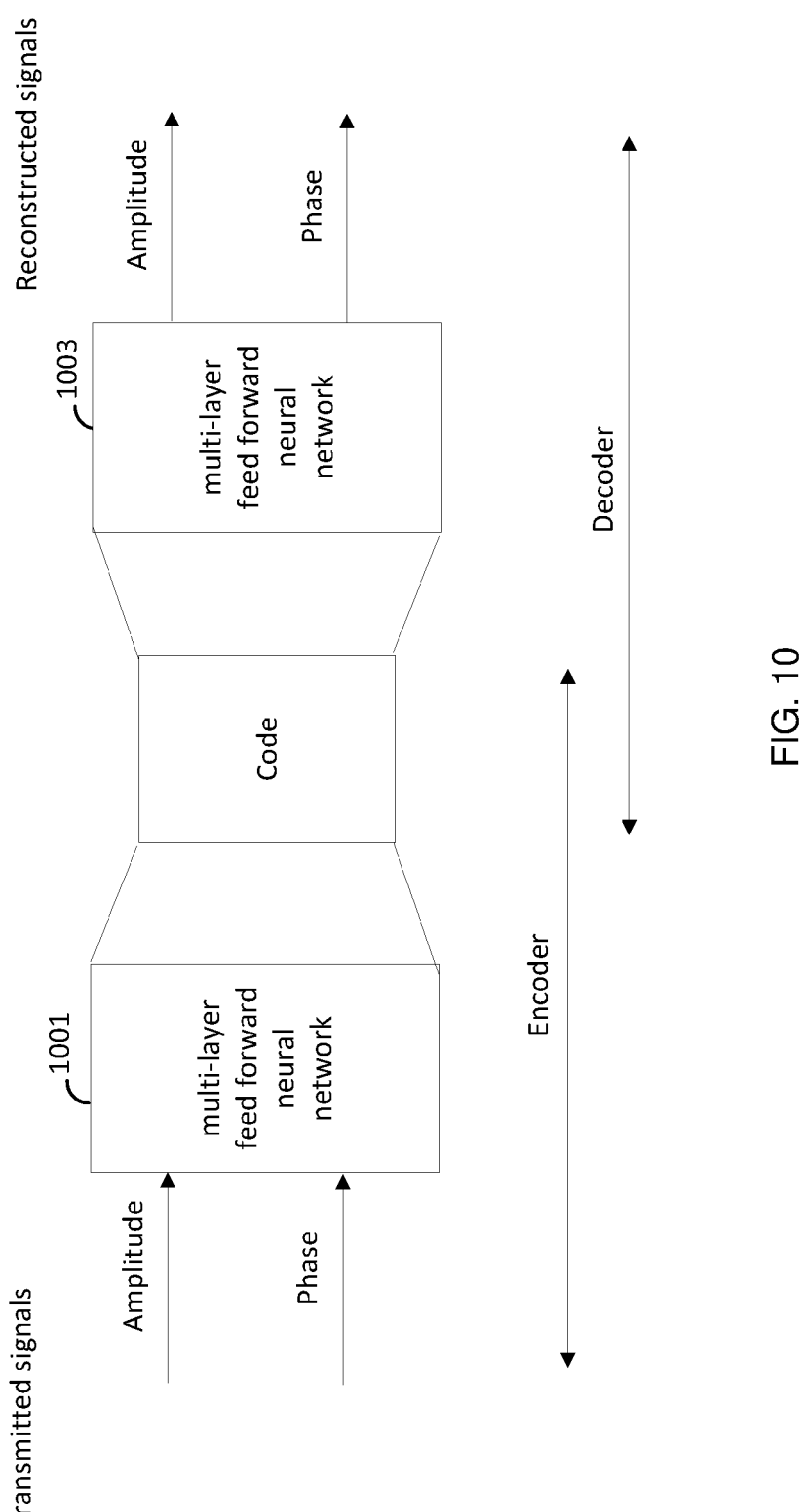
FIG. 10 illustrates a schematic of an autoencoder for signal reconstruction based on a trained nonlinearity profile using ATRS according to some embodiments.

FIG. 10 illustrates a schematic of an autoencoder for signal reconstruction based on a trained nonlinearity profile using ATRS according to some embodiments. In one example, an autoencoder (AE) can be used for reconstructing the original undistorted input signals from the received distorted signals subject to nonlinearities. The autoencoder as depicted in FIG. 10 is composed of two concatenated neural networks 1001, 1003 for the implementation of an encoder and a decoder. The encoder 1001 constructs a code which is a representation of input signal subject to nonlinearities and the decoder 1003 reconstructs the original signal from the code. The autoencoder can be trained based on the transmitted and received ATRS signals during the training phase in the nonlinearity identification block 931 in FIG. 9, and can be applied to the received signals during the data transmission for reconstructing the transmitted signals by compensating the nonlinearities.

Nonlinearity Compensation at Receiver Using Digital Post Distortion

Figure 11:
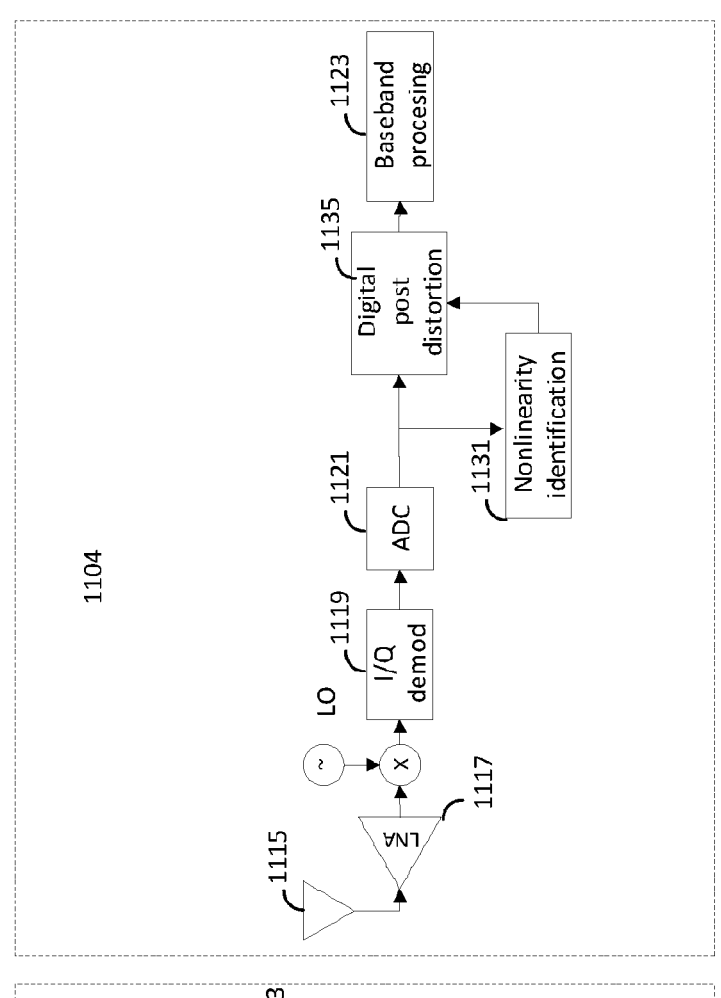
FIG. 11 illustrates a schematic diagram of a system with digital post distortion at a receiver enabled by an identified nonlinearity profile according to some embodiments.

FIG. 11 illustrates a schematic diagram of a system with digital post distortion at a receiver enabled by an identified nonlinearity profile according to some embodiments. In another embodiment, a method at receiver 1104 compensates the impact of hardware nonlinearities by nonlinear scaling of the received symbols, where a scaling can be applied to each received symbol or a group of received symbols where the amplitude and phase of the scaling factor depends on the location of the symbol or group of the received symbol in the I/Q plain as illustrated as follows:

$$y = a(x_I, x_Q) \times (x_I + j x_Q),$$

where the complex coefficient $\alpha(x_I, x_Q)$ is determined based on the inverse of the determined nonlinearity profile.

The schematic diagram of this method is shown in FIG. 11. The transmitter 1102 includes baseband processing 1101, DAC 1105, I/Q modulator 1107, PA 1111, and antenna 1113. The receiver 1104 includes an antenna 1115, LNA 1117, I/Q demodulator 1119, ADC 1121, and baseband processing 1123. Functional block 1131 is for nonlinearity identification as discussed above, and functional block 1134 provides digital post distortion using the identified nonlinearity profile.

Nonlinearity Compensation at Receiver Using Nonlinearity-Aware De-Mapper

In another embodiment, the nonlinearity profile can be used at the receiver for computing the soft bits as inputs to the decoders (e.g. LDPC or Turbo decoder) that take into account the impact of nonlinearities. For example, the log likelihood ratio (LLR) corresponding to the transmitted symbol 's', where $s = s_x + j s_y$ can be computed as follows $$\Lambda(s) =$$

$$-\frac{1}{2(1-\rho^2(s))}\left(\frac{(x-\mu_x(s))^2}{\sigma_x^2(s)} + \frac{(y-\mu_y(s))^2}{\sigma_y^2(s)} - \frac{2\rho(s)(x-\mu_x(s))(y-\mu_y(s))}{\sigma_x(s)\sigma_y(s)}\right)$$

where $\mu_x + j\mu_y = (\alpha_x + j\alpha_y) \times (s_x + js_y)$, and $\alpha = (\alpha_x + j\alpha_y)$ is the nonlinearity factor that is applied to the transmitted symbol 's' and can be determined during the nonlinearity profile identification step. The variables x and y are the real and the imaginary part of the equalized symbols at the receiver, p is the correlation coefficient between the real and imaginary part of the received signals, and $$\sigma_x^2 \text{ and } \sigma_y^2$$

are the variance of the received signal along the x and y axis, respectively. The schematic diagram of the receiver in which the demapper is enabled with the estimated nonlinearity profile is shown in FIG. 12.

Figure 12:
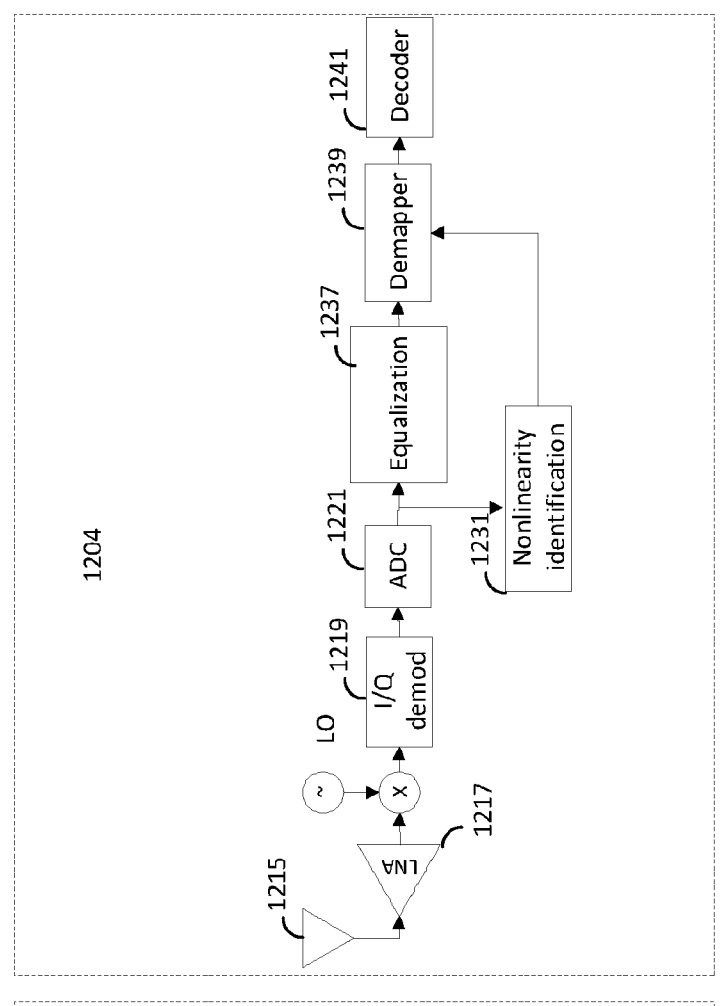
FIG. 12 illustrates a schematic diagram of a system with a demapper enabled with an identified nonlinearity profile according to some embodiments.
Figure 12:
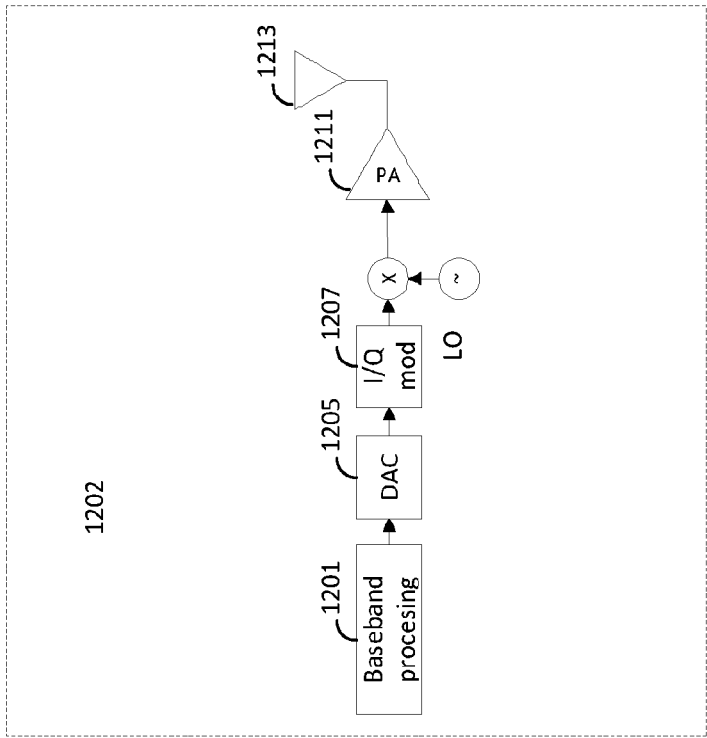

FIG. 12 illustrates a schematic diagram of a system with a demapper enabled with an identified nonlinearity profile according to some embodiments. The transmitter 1202 includes baseband processing 1201, DAC 1205, I/Q modulator 1207, PA 1211, and antenna 1213. The receiver 1204 includes an antenna 1215, LNA 1217, I/Q demodulator 1219, ADC 1221, and functional block 1231 for nonlinearity identification. Functional block 1237 provides equalization, functional block 1239 is a demapper, and functional block 1241 is a decoder.

707: Generating Feedback at the Receiver to Report the Identified Nonlinearity Profile to the Transmitter Another embodiment includes reporting the nonlinearity profile, which may include one or several of the following techniques.

Report Nonlinearity Profile

The receiver reports the identified nonlinearity profile identified in 703, where the report the includes the polynomial coefficients based on polynomial regression, the computed covariance matrix based on Gaussian regression method, or the weight and bias values of the neural network discussed above.

Report Setting Recommendation to Transmitter

The receiver can send a recommendation to the transmitter regarding setting the transmitter parameters, where the parameters to be set can include transmit power, MCS index, number of information layers for multi-antenna transmissions, carrier aggregation configuration, crest factor reduction algorithm settings, and/or digital-pre-distortion parameters.

Quantize Nonlinearity Profile

The receiver quantizes the quantities to be reported to the transmitter, where it can quantize each quantity individually or it can perform vector quantization to quantize multiple quantities jointly. The number of quantization bits can be pre-set.

709: Configuring Transmitter Parameters Based on the Reported Nonlinearity Profile Different parameters of the transmitter can be configured according to the feedback from the receiver regarding the identified nonlinearity. The feedback may include the nonlinearity profile, or a representation of the nonlinearity profile, or a recommendation based on a pre-configured table.

Figure 13:
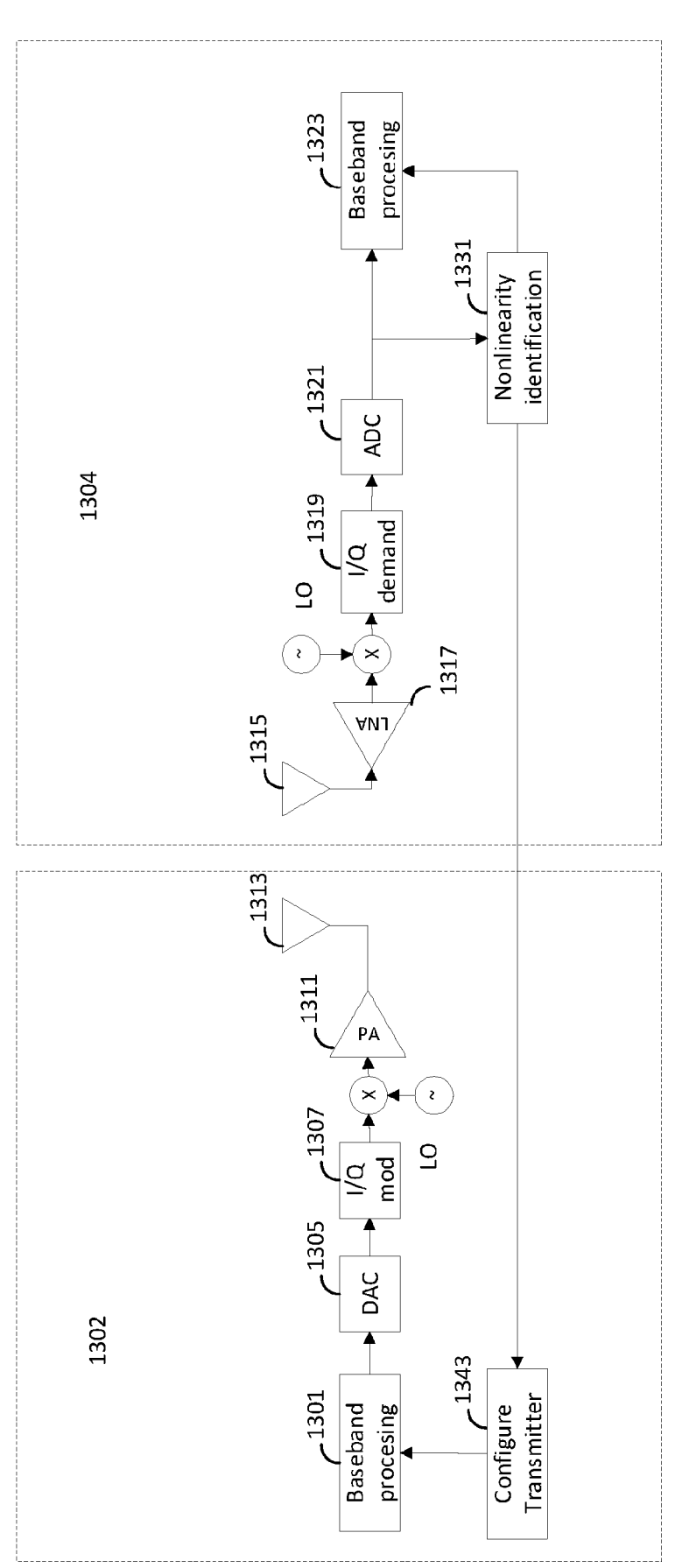
FIG. 13 illustrates a schematic diagram of a system with a transmitter configuration based on nonlinearity profile feedback from the receiver according to some embodiments.

FIG. 13 illustrates a schematic diagram of a system with a transmitter configuration based on nonlinearity profile feedback from the receiver according to some embodiments. The transmitter 1302 includes baseband processing 1301, DAC 1305, I/Q modulator 1307, PA 1311, and antenna 1313. According to this embodiment, the transmitter 1302 further includes functional block 1343 for configuring the transmitter based on feedback from the receiver regarding the nonlinearity identification 1331. The receiver 1304 includes an antenna 1315, LNA 1317, I/Q demodulator 1319, ADC 1321, baseband processing 1323, and nonlinearity identification 1331 as discussed above.

In the following embodiments, a list of possible configurations at the transmitter side based on the feedback is provided.

Configure Digital Pre Distortion (DPD) Parameters

Figure 14:
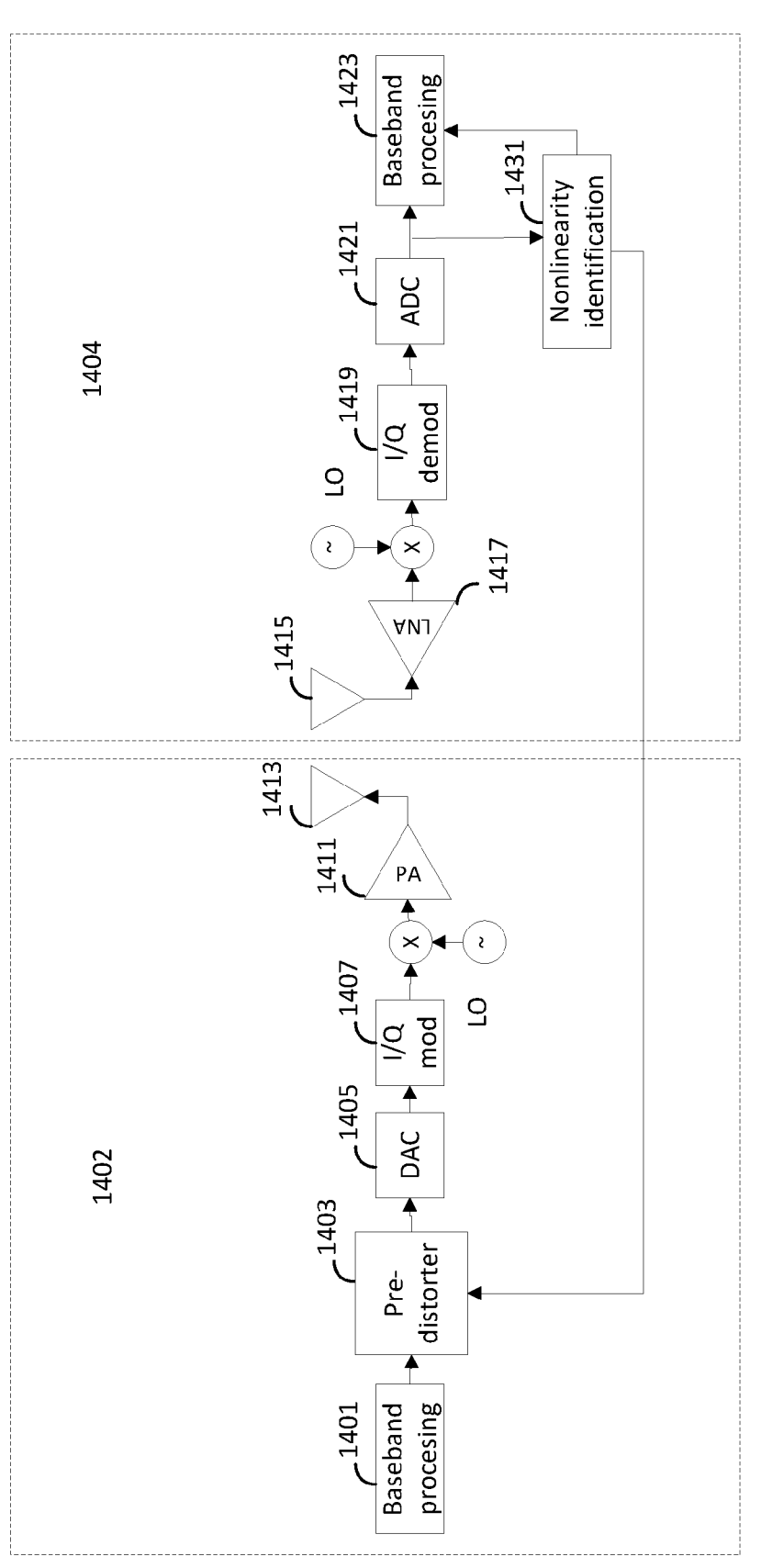
FIG. 14 illustrates a schematic diagram of a system with a digital pre distortion enabled with nonlinearity profile feedback from the receiver according to some embodiments.

The digital pre distortion parameters can be computed based on the provided estimate of nonlinearities from the receiver as illustrated in FIG. 14. FIG. 14 illustrates a schematic diagram of a system with a digital pre distortion enabled with nonlinearity profile feedback from the receiver according to some embodiments. The transmitter 1402 includes baseband processing 1401, DAC 1405, I/Q modulator 1407, PA 1411, and antenna 1413. According to this embodiment, the transmitter 1402 further includes functional block 1403 for configuring the pre distorter based on feedback from the receiver regarding the nonlinearity identification 1431. The receiver 1404 includes an antenna 1415, LNA 1417, I/Q demodulator 1419, ADC 1421, baseband processing 1423, and nonlinearity identification 1431 as discussed above.

The pre distortion parameters are computed such that the received signal effectively experiences linear or approximately linear power amplifier gain. The parameters of the digital pre distortion $\theta_{DPD}$ can be computed as a function of the estimated PA model parameters $\theta_{PA}$ as follows:

$$\theta_{DPD} = \mathrm{argmin}_\theta(\|y_d(n) - f_{PA}(f_{DPD}(y_d(n), \theta), \theta_{PA}) \times g\|)$$

where in this equation g is the effective gain of the received signal relative to the input of the power amplifier, $y_d(n)$ is the signal at the output of the ADC at the receiver side, $f_{PA}(x, \theta_{PA})$ is the PA characteristic function for identified model parameters $\theta_{PA}$ and the input signal x, $f_{DPD}(x, \theta)$ is the DPD characteristic function for given parameters $\theta$ and input x. The parameters $\theta_{PA}$ can be estimated using the introduced reference signal and can be provided to the transmitter to compute DPD parameters by solving the above optimization problem.

Adapt MCS Index

The transmitter can adapt the selected MCS index based on the reported identified nonlinearity. For example, if the nonlinearity is high, then, a lower MCS index can be selected to be more robust to nonlinearity. If the nonlinearity is low, then, a higher MCS index can be selected given that the received SNR is sufficiently high to support the higher MCS.

Adapt Power Control

The power control unit at the transmitter can adapt transmit power according to the identified nonlinearity profile. For example, if the reported nonlinearity is large, then the transmit power can be reduced so that the PA operates in more linear operating point. The level of power reduction can be determined using certain secondary objectives, for example, the amount of the out of band emission. For example, using a look up table, the nonlinearity level of the PA and the operating transmit power can be mapped to the measured adjacent carrier leakage ratio (ACLR), and based on the received feedback the operating transmit power can be selected to meet the constraints on ACLR.

Adapt the Number of Transmitted Information Layers in Multi-Antenna Systems

In multi-antenna systems in which multi-layers of information can be configured for data transmission, the number of transmit information layers can be adapted according to the channel state information and also the identified nonlinearity. If the level of nonlinearity is high, then the inter-layer interference increases, and the number of transmitted layers would need to be reduced for more reliable transmission. If the level of nonlinearity is low, then the inter-layer interference leakage would be negligible, and more layers can be transmitted by applying proper precoding.

Adapt Crest Factor Reduction (CFR)

Crest factor reduction refers to a technique to reduce peak to average power ratio (PAPR) of the transmitted signal so that the power amplifier can operate more efficiently. According to the identified nonlinearity, the transmitter can decide whether to apply crest factor reduction to maintain the PAPR within the desired limit. If according to the nonlinearity feedback and the PA operating point, the PA is operating in very nonlinear operating point, then CFR may be deactivated. If the CFR is activated, then the CFR parameters can be tuned based on the nonlinearity feedback. For example, using a pre-configured table, the level of nonlinearity can be mapped to the out of band emission. In order to maintain the out of band emission due to clipping and filtering to perform CFR, the low-pass filter parameters can be set based on the received feedback to maintain the out of band emission within the limit.

Adapt Resource Block Mapping

The transmitter can adapt resource block allocation and the minimum subcarrier spacing according to the reported nonlinearity to maintain the interference leakage from adjacent subcarriers within the limit. The higher nonlinearity leads to higher interference leakage from adjacent subcarrier, hence more spacing between adjacent subcarriers would be needed to avoid interference when there is sever nonlinearity.

Configure Carrier Aggregation

The transmitter can perform carrier aggregation when needed based on the reported nonlinearity. For example, when the nonlinearity level is high, and as a result the interference leakage to the adjacent subcarriers is high, the transmitter can split the transmitted information signal and transmit each over a separate band to reduce the inter carrier interference.

711: ATRS Transmission Capability Reporting

The transmitter 702 reports the capability to send ATRS at 711, for example a UE reports such capability in UL scenario. This reporting can then be used by the receiver 704 (e.g. a network node) to configure ATRS transmission (e.g. by a UE).

713: Nonlinearity Estimation Capability Reporting

The receiver 704 informs the transmitter 702 the capability to estimate transmitter nonlinearity based on ATRS (for example this can be in the form of broadcasting such functionality by the gNB in UL scenario).

715: [Optional] Requesting ATRS Transmission by Receiver

The receiver 704 sends an indication 715 to the transmitter 702 requesting to send ATRS for nonlinearity estimation. The indication in this case can be a dynamic indication in DCI, or a semi-static configuration in the RRC.

717: Configure ATRS at Transmitter or Receiver

ATRS can be configured at the transmitter 717A side or it can be configured at the receiver side 717B and sent to the transmitter via a feedback signal. Several aspects should be considered in configuration of ATRS, such as the tradeoff between accuracy and overhead, multiplexing capacity, interference, etc. The ATRS parameters such as the number of pilot signals, the periodicity of pilot transmission, and/or the power of signals can be configured to meet the desired requirements.

Considering the resource efficiency and multiplexing capacity of such design, i.e. accommodating multiple UEs to send ATRS in the same symbol, different multiplexing schemes in time-domain, frequency domain, or code domain can be considered. As an example, in case of frequency division multiplexing, ATRS from different UEs share frequency domain either by simply dividing the available number of subcarriers between themselves or by using a comb-like design. Or different users apply different phase rotation on their respective ATRS (code-division multiplexing).

Figure 15:
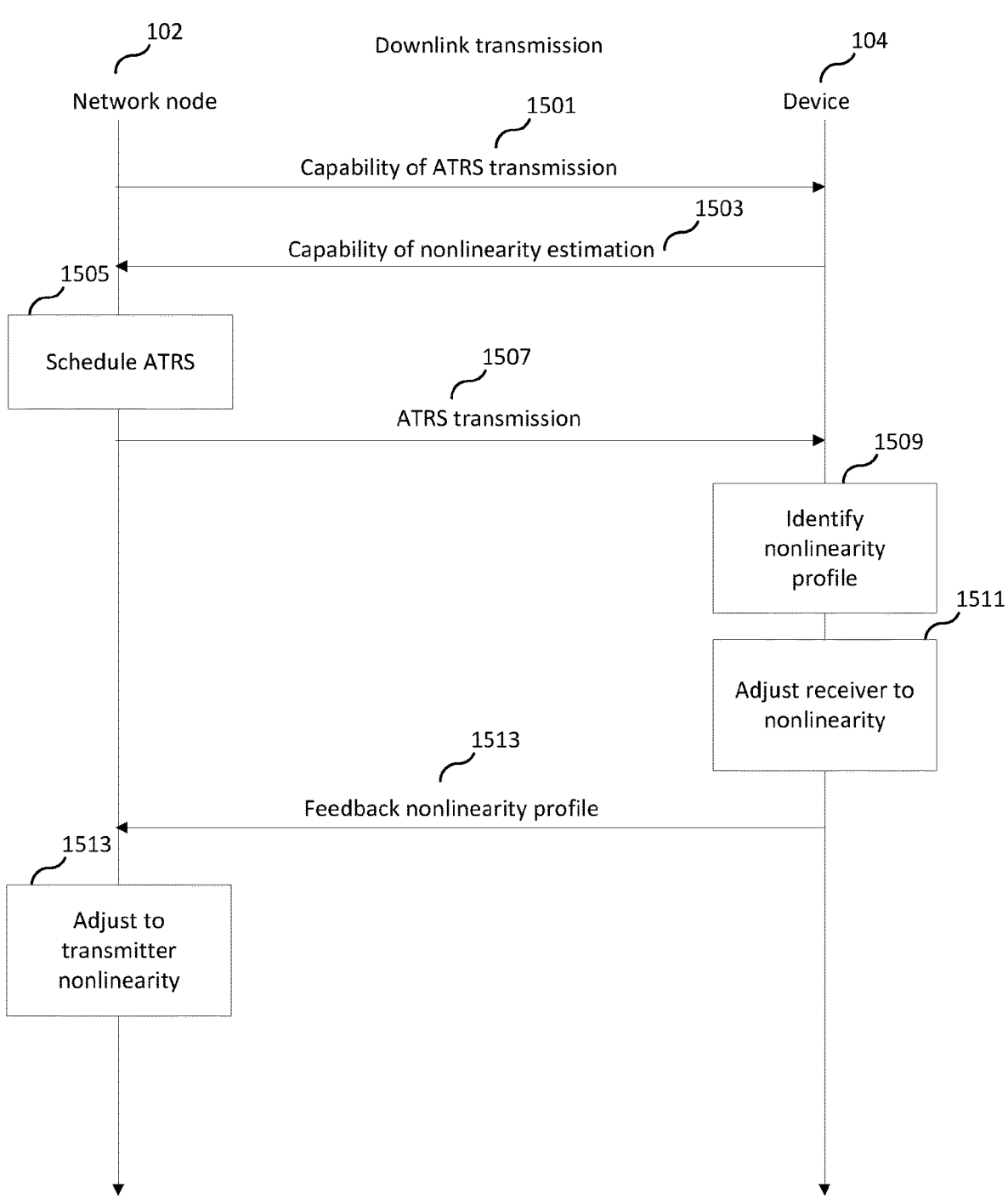
FIG. 15 is a downlink-signaling diagram according to some embodiments.

FIG. 15 is a downlink signaling diagram according to some embodiments. The signals that would be required between the network node 102 and the device 104 in downlink (DL) transmission are shown in FIG. 15. At 1501, the network node 102 reports capability of ATRS transmission to the device 104. At 1503, the device 104 reports capability of nonlinearity estimation to the network node 102. At 1505, the network node 102 schedules ATRS, and then transmits an ATRS transmission 1507 towards the device 104. At 1509, the device 104 identifies a nonlinearity profile, and at 1511, the device 104 adjusts the receiver based on the nonlinearity profile. At 1513, the device 104 reports feedback on the nonlinearity profile to the network node 102. At 1513, the network node 102 adjusts the transmitter to the nonlinearity.

Figure 16:
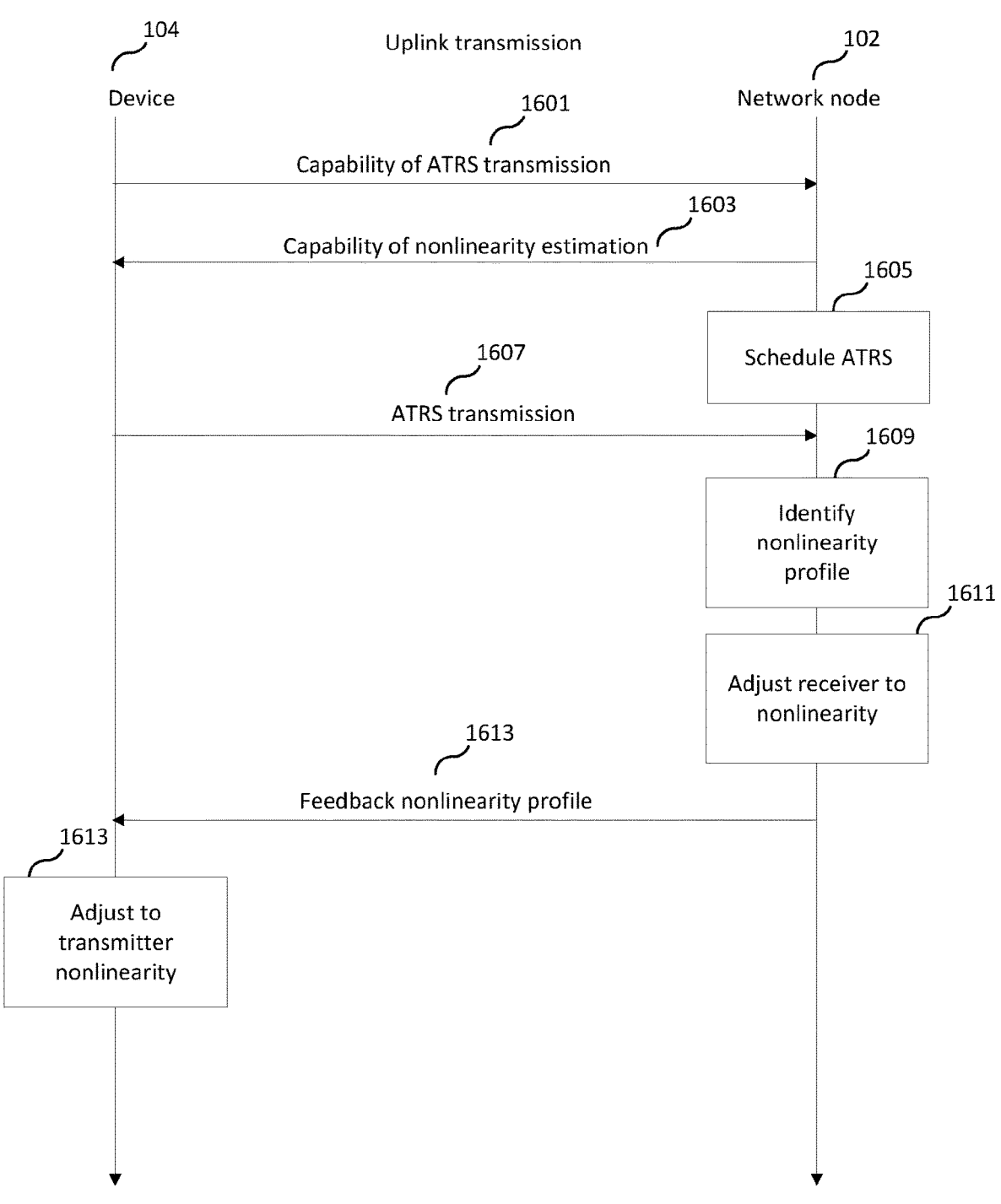
FIG. 16 is an uplink-signaling diagram according to some embodiments.

FIG. 16 is an uplink signaling diagram according to some embodiments. The signals that would be required between the network node 102 and the device 104 in uplink (UL) transmission are shown in FIG. 16. At 1601, the device 104 reports capability of ATRS transmission towards the network node 102. At 1603, the network node 102 reports capability of nonlinearity estimation 1603 towards the device 104. At 1605, the network node schedules an ATRS, and at 1607 receives an ATRS transmission from the device 104. At 1609, the network node 102 identifies the nonlinearity profile. At 1611, the network node 102 adjusts the receiver to the nonlinearity. At 1613 the network node 102 reports feedback on the nonlinearity profile towards the device 104. At 1613, the device 104 adjusts the transmitter to the nonlinearity.

Figure 17:
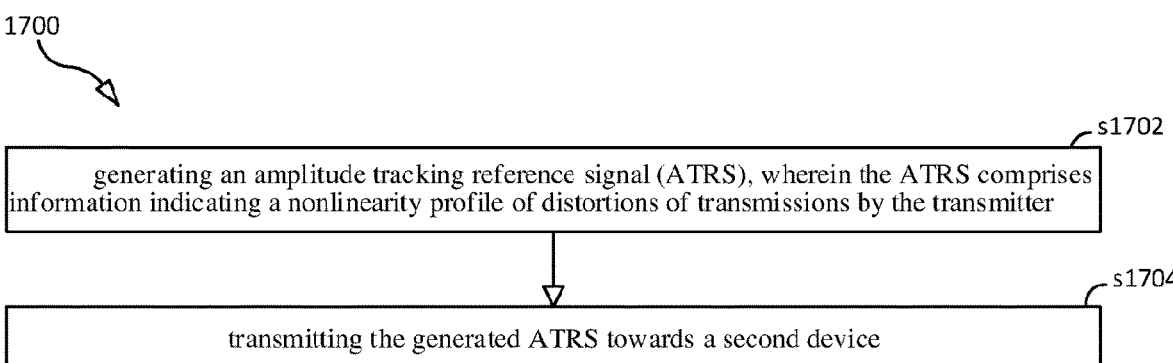
FIG. 17 illustrates a method according to some embodiments.

FIG. 17 illustrates a method according to some embodiments. In some embodiments, method 1700 is performed by a transmitter in a first device. The first device may be a network node 102 or a UE 104 as described above. At step s1702, the transmitter performs the step of generating an amplitude tracking reference signal (ATRS), wherein the ATRS includes information indicating a nonlinearity profile of distortions of transmissions by the transmitter. The ATRS is discussed in further detail above in connection with FIG. 7, and particularly in connection with 701. At step s1704, the transmitter transmits the generated ATRS towards a second device.

Figure 18:
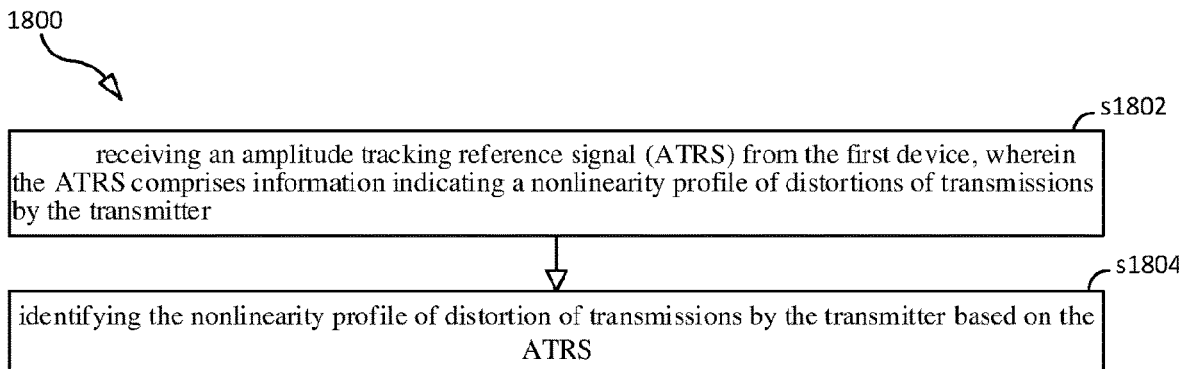
FIG. 18 illustrates a method according to some embodiments.

FIG. 18 illustrates a method according to some embodiments. In some embodiments, method 1800 is performed by a receiver in a second device. The second device may be a network node 102 or a UE 104 as described above. At step s1802, the second device receives an amplitude tracking reference signal (ATRS) from a first device, wherein the ATRS comprises information indicating a nonlinearity profile of distortions of transmissions by a transmitter of the first device. The ATRS is discussed in further detail above in connection with FIG. 7, and particularly in connection with 701. At step s1804, the second device identifies the nonlinearity profile of distortions of transmissions by the transmitter based on the ATRS. The identification of the nonlinearity profile is described in further detail above in connection with FIG. 7, and particularly in connection with 703.

Figure 19:
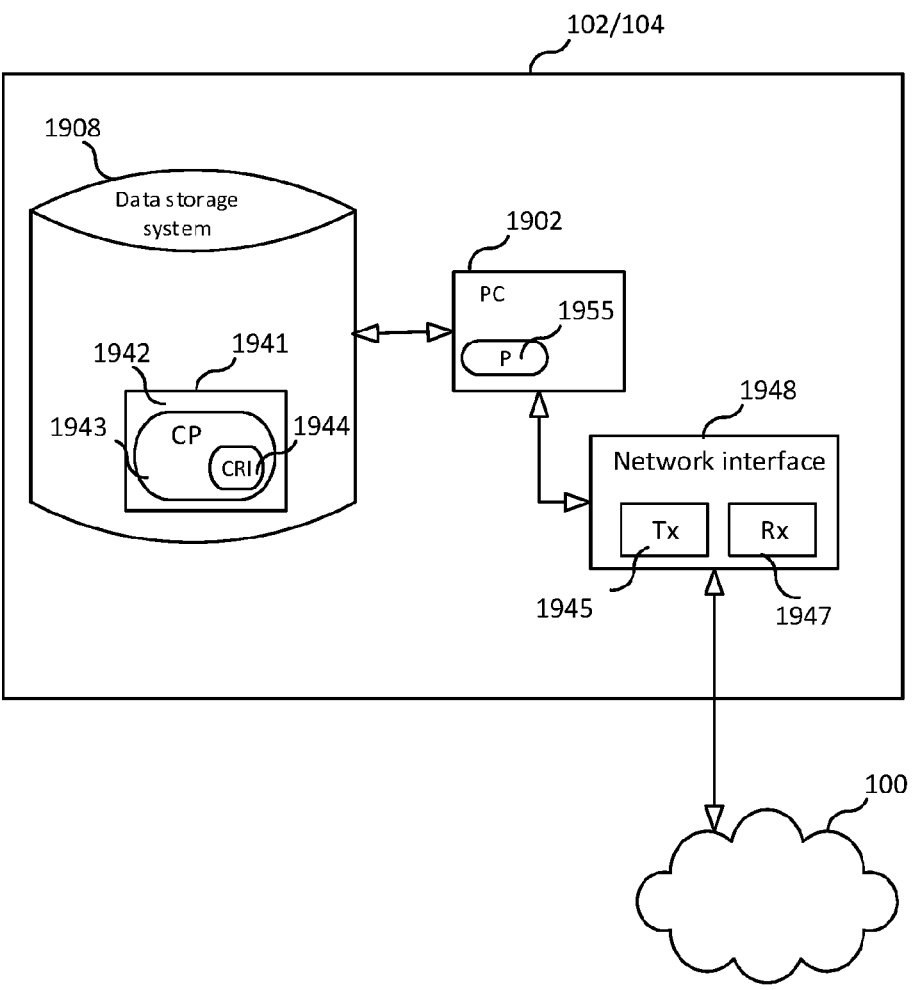
FIG. 19 is a block diagram of an apparatus according to some embodiments.

FIG. 19 is a block diagram of an apparatus according to some embodiments. In some embodiments, apparatus may comprise one or more of the components for a UE 104 or network node 102 as described above. As shown in FIG. 19, the apparatus may comprise: processing circuitry (PC) 1902, which may include one or more processors (P) 1955 (e.g., one or more general purpose microprocessors and/or one or more other processors, such as an application specific integrated circuit (ASIC), field-programmable gate arrays (FPGAs), and the like); communication circuitry 1948, comprising a transmitter (Tx) 1945 and a receiver (Rx) 1947 for enabling the apparatus to transmit data and receive data (e.g., wirelessly transmit/receive data); and a local storage unit (a.k.a., "data storage system") 1908, which may include one or more non-volatile storage devices and/or one or more volatile storage devices. In embodiments where PC 1902 includes a programmable processor, a computer program product (CPP) 1941 may be provided. CPP 1941 includes a computer readable medium (CRM) 1942 storing a computer program (CP) 1943 comprising computer readable instructions (CRI) 1944. CRM 1942 may be a non-transitory computer readable medium, such as, magnetic media (e.g., a hard disk), optical media, memory devices (e.g., random access memory, flash memory), and the like. In some embodiments, the CRI 1944 of computer program 1943 is configured such that when executed by PC 1902, the CRI causes the apparatus to perform steps described herein (e.g., steps described herein with reference to the flow charts). In other embodiments, the apparatus may be configured to perform steps described herein without the need for code. That is, for example, PC 1902 may consist merely of one or more ASICs. Hence, the features of the embodiments described herein may be implemented in hardware and/or software.

While various embodiments are described herein, it should be understood that they have been presented by way of example only, and not limitation. Thus, the breadth and scope of this disclosure should not be limited by any of the above described embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

ABBREVIATIONS

AM/AM Amplitude modulation to amplitude modulation
AM/PM Amplitude modulation to phase modulation
ATRS Amplitude tracking reference signal
FFT Fast Fourier transform
IFFT Inverse fast Fourier transform
PAPR Peak to average power ratio

The invention claimed is:

1. A method performed by a transmitter in a first device for signaling a nonlinearity profile of distortion of transmissions in a communications network, the method comprising:
   generating an amplitude tracking reference signal (ATRS), wherein the ATRS comprises information indicating a nonlinearity profile of distortions of transmissions by the transmitter; and
   transmitting the generated ATRS towards a second device.

2. The method of claim 1, further comprising:
   receiving a first message from the second device, wherein the first message comprises information relating to an identified nonlinearity profile of distortions of transmissions by the transmitter based on the information in the ATRS.

3. The method of claim 2, further comprising:
   configuring the transmitter based on the information relating to the identified nonlinearity profile.

4. The method of claim 3, wherein the configuring comprises one or more of:
   performing digital pre-distortion at the transmitter to reduce a distortion,
   adapting a Modulation Coding Scheme (MCS) index,
   controlling transmit power of the transmitter,
   adapting a number of transmit information layers in a multi-antenna system,
   adapting a crest factor reduction (CFR) that reduces peak to average power ratio of a signal,
   adapting a radio resource mapping, or
   configuring a carrier aggregation.

5. The method of claim 1, further comprising:
   transmitting a second message towards the second device, the second message comprising information indicating a capability of the first device to transmit the ATRS.

6. The method of claim 5, further comprising:
   receiving a third message in response to the second message, the third message comprising a configuration of a transmission of the ATRS.

7. The method of claim 1, further comprising:
   receiving a fourth message from the second device, the fourth message comprising a request for an ATRS from the transmitter.

8. The method of claim 1, further comprising:
   receiving a fifth message from the second device, the fifth message comprising information indicating a capability of the second device to identify the nonlinearity profile of distortions of transmissions by the transmitter based on an ATRS.

9. The method of claim 1, wherein the information indicating the nonlinearity profile of distortions of transmission by the transmitter comprises a preconfigured sequence of symbols over a preconfigured period having a varying range of amplitudes.

10. The method of claim 1, further comprising:
   mapping the generated ATRS to one or more radio resource blocks across a time-frequency domain based on a rate of change of nonlinearity of distortions in the time-frequency domain.

11. A method performed by a receiver in a second device for identifying a nonlinearity profile of distortion of transmissions in a communications network by a transmitter in a first device, the method comprising:
   receiving an amplitude tracking reference signal (ATRS) from the first device, wherein the ATRS comprises information indicating a nonlinearity profile of distortions of transmissions by the transmitter; and identifying the nonlinearity profile of distortion of transmissions by the transmitter based on the ATRS.

12. The method of claim 11, further comprising:
configuring the receiver based on the identified nonlinearity profile of distortions of transmission by the transmitter.

13. The method of claim 11, further comprising:
generating a first message, wherein the first message comprises information relating to the identified nonlinearity profile of distortions of transmission by the transmitter; and
transmitting the first message towards the first device.

14. The method of claim 11, further comprising:
receiving a second message from the first device, the second message comprising information indicating a capability of the first device to transmit the ATRS.

15. The method of claim 14, further comprising:
generating a third message in response to the second message, the third message comprising a configuration of a transmission of the ATRS; and
transmitting the third message towards the first device.

16. The method of claim 11, further comprising:
generating a fourth message, the fourth message comprising a request for an ATRS; and
transmitting the fourth message towards the first device.

17. The method of claim 11, further comprising:
generating a fifth message, the fifth message comprising information indicating a capability of the second device to identify the nonlinearity profile of distortions of transmissions by the transmitter based on an ATRS; and
transmitting the fifth message towards the first device.

18. The method of claim 11, wherein the information indicating the nonlinearity profile of distortions of transmissions by the transmitter comprises a preconfigured sequence of symbols over a preconfigured period having a varying range of amplitudes.

19. A first device comprising a transmitter adapted to:
generate an amplitude tracking reference signal (ATRS), wherein the ATRS comprises information indicating a nonlinearity profile of distortions of transmissions by the transmitter; and
transmit the generated ATRS towards a second device.

20. A second device comprising a receiver adapted to:
receive an amplitude tracking reference signal (ATRS) from a first device in a communications network, wherein the ATRS comprises information indicating a nonlinearity profile of distortions of transmissions by a transmitter of the first device; and
identify the nonlinearity profile of distortion of transmissions by the transmitter based on the ATRS.

* * * * *